US010128228B1

(12) United States Patent
Gao et al.

(10) Patent No.: US 10,128,228 B1
(45) Date of Patent: Nov. 13, 2018

(54) TYPE III-V SEMICONDUCTOR DEVICE WITH INTEGRATED DIODE

(71) Applicant: Infineon Technologies Americas Corp., El Segundo, CA (US)

(72) Inventors: Guang-Bo Gao, Ceritos, CA (US); Zhaofeng Wang, Temecula, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 21 days.

(21) Appl. No.: 15/629,783

(22) Filed: Jun. 22, 2017

(51) Int. Cl.
| | | |
|---|---|---|
| *H01L 29/15* | (2006.01) | |
| *H01L 27/02* | (2006.01) | |
| *H01L 29/20* | (2006.01) | |
| *H01L 29/205* | (2006.01) | |
| *H01L 29/778* | (2006.01) | |
| *H01L 29/861* | (2006.01) | |
| *H01L 27/06* | (2006.01) | |

(Continued)

(52) U.S. Cl.
CPC ...... *H01L 27/0255* (2013.01); *H01L 27/0605* (2013.01); *H01L 27/0629* (2013.01); *H01L 29/04* (2013.01); *H01L 29/0649* (2013.01); *H01L 29/0684* (2013.01); *H01L 29/16* (2013.01); *H01L 29/2003* (2013.01); *H01L 29/205* (2013.01); *H01L 29/402* (2013.01); *H01L 29/7787* (2013.01); *H01L 29/861* (2013.01)

(58) Field of Classification Search
CPC ............... H01L 29/8611; H01L 29/778; H01L 29/7784; H01L 29/7785
USPC ...................................................... 257/76, 77
See application file for complete search history.

(56) References Cited

U.S. PATENT DOCUMENTS 9,748,224 B2 * 8/2017 Padmanabhan ..... H01L 27/0629
2002/0190270 A1 12/2002 Emrick
(Continued)

OTHER PUBLICATIONS

Chumbes, E M., "AlGaN/GaN High Electron Mobility Transistors on Si(111) Substrates", IEEE Transactions on Electron Devices, vol. 48, No. 3, Mar. 2001, pp. 420-426.
(Continued)

*Primary Examiner* — David Vu
*Assistant Examiner* — Brandon Fox
(74) *Attorney, Agent, or Firm* — Murphy, Bilak & Homiller, PLLC (57) ABSTRACT

A semiconductor device includes a type IV semiconductor base substrate, a first type III-V semiconductor layer formed over the base substrate, a second type III-V semiconductor layer formed over the first type III-V semiconductor layer. A two-dimensional charge carrier gas forms at an interface between the first and second type III-V semiconductor layers. First and second electrically conductive device terminals are in ohmic contact with the two-dimensional charge carrier gas. A gate electrode is formed on the first type III-V semiconductor layer and is configured to control a conduction state of the two-dimensional charge carrier gas. An electrically insulating region is disposed over the second type III-V semiconductor layer and is laterally between the gate electrode and the second electrically conductive device terminal. At least one diode is formed on the electrically insulating region and is electrically connected between the gate electrode and the second electrically conductive device terminal.

14 Claims, 4 Drawing Sheets

(51) Int. Cl.
*H01L 29/16* (2006.01)
*H01L 29/40* (2006.01)
*H01L 29/06* (2006.01)
*H01L 29/04* (2006.01)

(56) References Cited

U.S. PATENT DOCUMENTS

| | | |
|---|---|---|
| 2008/0124889 A1 | 5/2008 | Roggenbauer et al. |
| 2008/0315257 A1 | 12/2008 | Shiraishi |
| 2009/0050939 A1 | 2/2009 | Briere |
| 2009/0189191 A1 | 7/2009 | Sato et al. |
| 2010/0200920 A1* | 8/2010 | Su .................. H01L 27/0255 257/355 |
| 2010/0301396 A1 | 12/2010 | Briere |
| 2011/0210337 A1 | 9/2011 | Briere |
| 2012/0153300 A1* | 6/2012 | Lidow .................. H01L 21/743 257/77 |
| 2012/0218783 A1* | 8/2012 | Imada .................. H01L 29/402 363/17 |
| 2013/0168737 A1 | 7/2013 | Prechtl et al. |
| 2014/0159119 A1* | 6/2014 | Derluyn ............ H01L 29/66462 257/194 |
| 2014/0346570 A1* | 11/2014 | Ueno .................. H01L 27/0605 257/195 |

OTHER PUBLICATIONS

Chung, J. W. et al., "GaN-on-Si Technology, A New Approach for Advanced Devices in Energy and Communications", Proceedings of the European Solid-State Device Research Conference, Sevilla, Spain, Sep. 14-16, 2010, pp. 14-16.

Curatola, Gilberto et al., "High Electron Mobility Transistor with Carrier Injection Mitigation Gate Structure", U.S. Appl. No. 14/991,517, filed Jan. 8, 2016, pp. 1-38.

Derluyn, J. et al., "Low Leakage High Breakdown E-Mode GaN DHFET on Si by Selective Removal of In-Situ Grown Si3N4", IEEE International Electron Devices Meeting, Baltimore, MD, USA, Dec. 2009, pp. 157-160.

* cited by examiner

TYPE III-V SEMICONDUCTOR DEVICE WITH INTEGRATED DIODE

TECHNICAL FIELD

The instant application relates to semiconductor devices, and in particular relates to high-electron-mobility devices with high voltage ratings.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility transistor) also known as heterostructure FET (HFET) and modulation-doped FET (MODFET) are used in a variety of applications. An HEMT is a transistor with a junction between two materials having different band gaps, such as GaAs and AlGaAs, and GaN and AlGaN.

HEMTs are viewed as an attractive candidate for microwave and power transistor applications, i.e. applications in which switching of substantially large voltages and/or currents is required. HEMTs offer high conduction and low power losses in comparison to conventional silicon based devices.

HEMTs are commonly formed from III-V semiconductor materials, such as GaAs, GaN, InGaN, AlGaN, etc. In a GaN/AlGaN based HEMT, a two-dimensional electron gas (2DEG) arises at the interface between the AlGaN barrier layer and the GaN buffer layer due to spontaneous and piezoelectric polarization. The 2DEG forms the channel of the device instead of a doped region. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

One drawback of type III-V semiconductor HEMTs in comparison to conventional MOSFET devices is the lack of protection mechanism for accommodating large voltage spikes. A conventional MOSFET device includes an intrinsic body diode by virtue of the p-n junction between the drain and body of the device. This intrinsic body diode is antiparallel to source-drain, and provides a leakage path at reveres bias and high transient voltage situation of the device. By contrast, a type III-V semiconductor HEMT does not include a corresponding diode. It utilizes the high resistive wide band gap semiconductor materiel, such as GaAs or GaN, as the insulation between source and drain. As a result, the highly resistive materiel in the drain and drift region and the gate and field plate form capacitors. At high reveres bias, high transient voltage pulse, ESD (electrostatic discharge), or other high voltage situations, the capacitors can be damaged and catastrophic breakdown can occur. This breakdown is the leakage current or hot carrier cumulated result. This is a primary failure mechanism of HEMTs.

SUMMARY

A semiconductor device is disclosed. According to an embodiment, the semiconductor device includes a type IV semiconductor base substrate, a first type III-V semiconductor layer formed over a first surface of the base substrate, and a second type III-V semiconductor layer formed over the first type III-V semiconductor layer. The second type III-V semiconductor layer has a different bandgap as the first type III-V semiconductor layer such that a two-dimensional charge carrier gas forms at an interface between the first and second type III-V semiconductor layers. The semiconductor device further includes first and second electrically conductive device terminals that are in ohmic contact with the two-dimensional charge carrier gas and are laterally spaced apart from one another. The semiconductor device further includes a gate electrode formed on the first type III-V semiconductor layer and being configured to control a conduction state of the two-dimensional charge carrier gas between the first and second electrically conductive device terminals. The semiconductor device further includes an electrically insulating region disposed over the second type III-V semiconductor layer and being laterally between the gate electrode and the second electrically conductive device terminal. The semiconductor device further includes at least one diode electrically connected between the gate electrode and the second electrically conductive device terminal. The at least one diode is formed on the electrically insulating region.

According to another embodiment, the semiconductor device includes a type IV semiconductor base substrate, a first type III-V semiconductor layer formed over a first surface of the base substrate, and a second type III-V semiconductor layer formed over the first type III-V semiconductor layer. The second type III-V semiconductor layer has a different bandgap as the first type III-V semiconductor layer such that a two-dimensional charge carrier gas forms at an interface between the first and second type III-V semiconductor layers. The semiconductor device further includes first and second electrically conductive device terminals that are in ohmic contact with the two-dimensional charge carrier gas and are laterally spaced apart from one another. The semiconductor device further includes a gate electrode formed on the first type III-V semiconductor layer and being configured to control a conduction state of the two-dimensional charge carrier gas between the first and second electrically conductive device terminals. The semiconductor device further includes an electrically conductive field plate disposed over the second type III-V semiconductor layer and being laterally between the gate electrode and the second electrically conductive device terminal. The electrically conductive field plate is configured to deplete the two-dimensional charge carrier gas during an off state of the two-dimensional charge carrier gas. The electrically conductive field plate comprises at least one diode integrally formed within the electrically conductive field plate.

According to another embodiment, the semiconductor device includes a type IV semiconductor base substrate, a first type III-V semiconductor layer formed over a first surface of the base substrate, and a second type III-V semiconductor layer formed over the first type III-V semiconductor layer. The second type III-V semiconductor layer has a different bandgap as the first type III-V semiconductor layer such that a two-dimensional charge carrier gas forms at an interface between the first and second type III-V semiconductor layers. The semiconductor device further includes first and second electrically conductive device terminals that are in ohmic contact with the two-dimensional charge carrier gas and are laterally spaced apart from one another. The semiconductor device further includes a gate electrode formed on the first type III-V semiconductor layer and being configured to control a conduction state of the two-dimensional charge carrier gas between the first and second electrically conductive device terminals. The semiconductor device further includes a plurality of diodes electrically connected between the first and second electrically conductive device terminals. Each of the diodes in the plurality are integrally formed within the type IV semiconductor base substrate.

Those skilled in the art will recognize additional features and advantages upon reading the following detailed description, and upon viewing the accompanying drawings,

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include a type III-V semiconductor device with a plurality of diodes integrally formed within a region or component of the type III-V semiconductor device. The device can include a type IV semiconductor base substrate, such as a silicon wafer, that forms a foundational layer of the device. A number of epitaxial type III-V semiconductor layers are formed thereon, including a type III-V semiconductor buffer region and a type III-V semiconductor barrier region having a different bandgap as the buffer region. An electrically conductive two-dimensional carrier gas arises between the barrier and buffer regions, and forms the channel of the device. Electrically conductive source and drain electrodes are in ohmic contact with the two-dimensional carrier gas. A gate structure is configured to control a conductive state of the two-dimensional carrier gas in a commonly known manner. Optionally, the device may include an electrically conductive field plate that is disposed between the gate and drain electrode.

Figure 3:
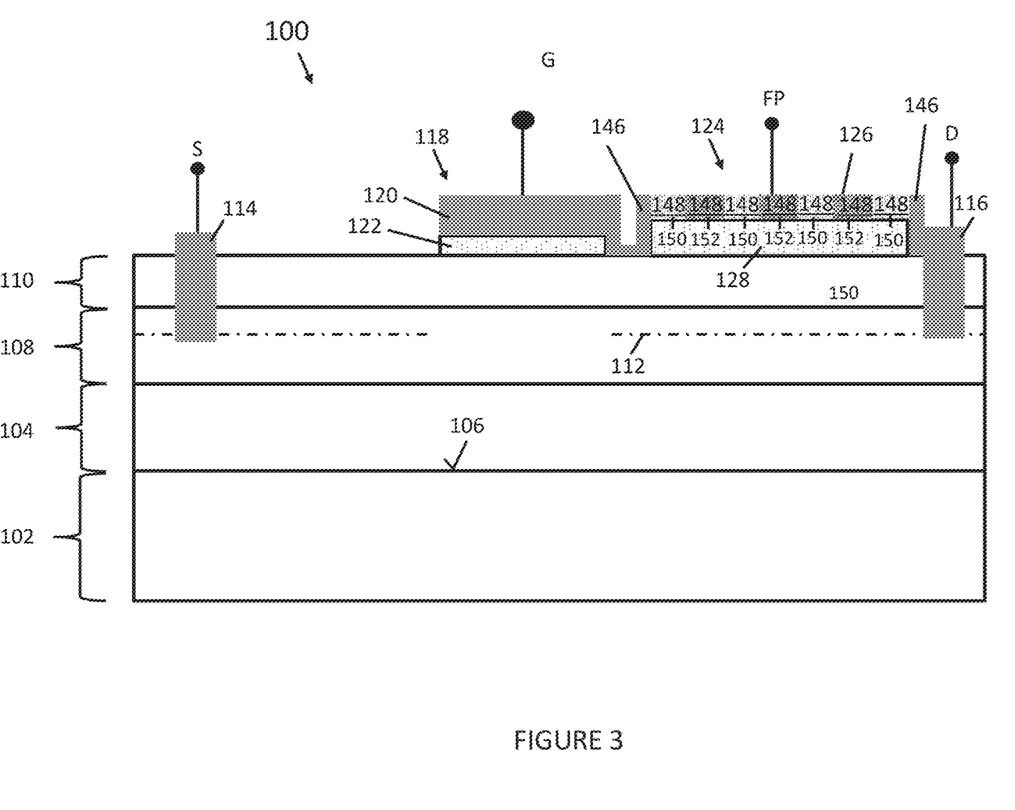
FIG. 3 illustrates a type III-V semiconductordevice with at least one diode integrally formed within the field plate of the device, according to an embodiment.

According to one embodiment, the type III-V semiconductor device includes diodes that are integrally formed into the field plate of the device. More particularly, according to one embodiment, the field plate is formed from a layer of polysilicon that is deposited over an electrically insulating region, which in turn is located between the gate and drain electrodes of the device. This layer of polysilicon is selectively doped to form oppositely doped regions. As a result, the layer of polysilicon includes a number of p-n junctions that provide the function of a diode, e.g., current rectification. Advantageously, these diodes provide an alternative current path in the device that permits current to safely dissipate in the case of a high voltage condition at the drain of the device. In one embodiment, the diodes are connected in series with opposite polarity, i.e, with two diodes being connected cathode to cathode. The diodes in this arrangement can be configured as clamping diodes so as to evenly distribute voltage across the field plate dielectric and improve the switching performance of the device.

Figure 1:
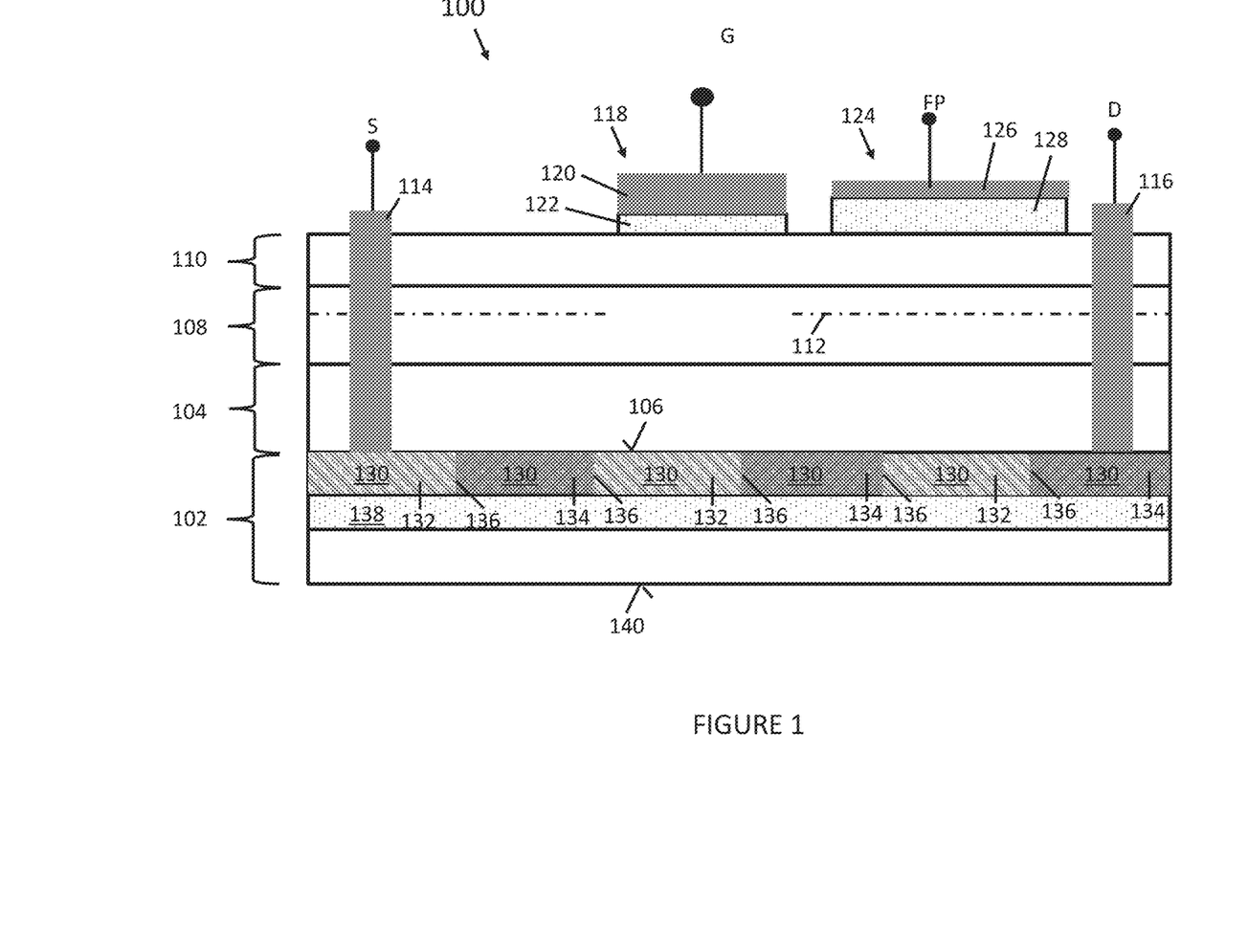
FIG. 1 illustrates a type III-V semiconductor device with a plurality of diodes integrated within the base substrate of the device, according to an embodiment.

According to another embodiment, the type III-V semiconductor device includes diodes that are integrally formed into the base substrate of the device. More particularly, according to one embodiment, the base substrate includes a plurality of doped semiconductor regions that are formed at the upper surface of the base substrate. These doped semiconductor regions form p-n junctions with one another. Electrical contact to the doped semiconductor regions can be provided by contacts that vertically extend from the type III-V semiconductor buffer and barrier regions to the surface of the base substrate. In one embodiment, the doped semiconductor regions are arranged to provide a plurality (i.e., two or more) of p-n junctions that are connected in series with the source and drain electrodes of the device, Moreover, the series connected diodes have the same polarity with the cathode of one diode connected to the anode of the subsequent diode. Advantageously, these diodes provide an alternative current path that permits current to safely dissipate from the drain terminal without damaging the gate structure and/or the field plate dielectric. Moreover, by providing multiple diodes instead of a single diode, this configuration advantageously decreases the series drain-source parasitic capacitance of the device in comparison to a device configuration in which only one diode is provided between the drain and source.

Referring to FIG. 1, a semiconductor device 100 is depicted, according to an embodiment. The semiconductor device 100 includes a base substrate 102. The base substrate 102 can include any semiconductor material suitable for the epitaxial growth of a type III-V semiconductor thereon. Exemplary materials for the base substrate 102 include group IV semiconductor aterials such as silicon (Si), and compound group IV semiconductor materials such as silicon carbide (SiC) or silicon germanium (SiGe).

According to an embodiment, the base substrate 102 is provided from a commercially available bulk silicon wafer. The bulk silicon wafer can have an intrinsic net doping type of a first conductivity type (e.g., n-type) or a second conductivity type (e.g., p-type). The intrinsic doping concentration of the base substrate 102 can vary from lightly doped to heavily doped, e.g., between $10^{14}$ dopant atoms/cm$^3$ to $10^{19}$ dopant atoms/cm$^3$. According to one embodiment, the intrinsic doping concentration of the base substrate 102 is in the range of $1\times10^{15}$-$1\times10^{16}$ dopant atoms/cm$^3$. Optionally, the base substrate 102 can include one or more layers of epitaxially grown type IV semiconductor material (e.g., Si) that are formed on a main surface of the bulk Silicon wafer.

The semiconductor device 100 further includes a transition region 104 formed on an upper surface 106 of the base substrate 102. The transition region 104 is configured to, among other things, facilitate epitaxial growth of high quality III-V semiconductor crystalline material thereon, and to alleviate stress between the base substrate 102 and the III-V semiconductor layers formed on top of the transition region 104. The transition region 104 may include at least one relatively thin (e.g., ≤300 nm) nucleation layer that is formed directly on the upper surface 106 of the base substrate 102. This nucleation layer may be a layer of Aluminum Nitride (AlN), for example. Alternatively, the nucleation layer can be a compound semiconductor layer having multiple semiconductor layers of different composition. For example, the nucleation layer may include two or more nitride layers that are separated from one another by another by a doped type III-V semiconductor nitride layer.

The transition region 104 may additionally include one or more lattice transition layers. The lattice transition layers are configured to alleviate stress that is attributable to crystalline lattice mismatch between the base substrate 102 and III-V semiconductor layers formed on the transition region 104. The lattice transition layers may include one or more metallic semiconductor nitride (e.g., AlGaN) layers with a gradually diminishing metallic content with increasing separation distance from the base substrate 102. According to another embodiment, the lattice transition layers are provided by multiple nitride layers (e.g., AlN) periodically interposed between multiple type III-V semiconductor layers (e.g. GaN).

The semiconductor device 100 further includes first and second type III-V semiconductor layers 108, 110. The first type III-V semiconductor layer 108 can be formed above or directly on the transition region 104, and the second type III-V semiconductor layer 110 can be formed above or directly on the first type III-V semiconductor layer 108. The second type III-V semiconductor layer 110 is formed from a semiconductor material having a different band gap than the first type III-V semiconductor layer 108. Due to this difference in band gap, a two-dimensional charge carrier gas channel 112 arises near the interface between the first type III-V semiconductor layer 108 and the second type III-V semiconductor layer 110 due to polarization effects. Thus, the first type III-V semiconductor layer 108 forms a so-called buffer layer and the second type III-V semiconductor layer 110 forms a so-called barrier layer of the semiconductor device 100.

According to an embodiment, the first type III-V semiconductor layer 108 includes gallium nitride (GaN) and the second type III-V semiconductor layer 110 includes aluminum gallium nitride (AlGaN). The first type III-V semiconductor layer 108 can be an intrinsic layer of pure or essentially pure GaN. Alternatively, the first type III-V semiconductor layer 108 can include AlGaN with a very low Al content (e.g., ≤10%) and, in addition or in the alternative, may include dopant atoms such as (e.g., carbon or iron). Both of the first and second type III-V semiconductor layers 108, 110 can be formed by epitaxial growth techniques, for example.

The semiconductor device 100 further includes first and second electrically conductive device terminals 114, 116 that are formed on the second type III-V semiconductor layer 110. The first and second electrically conductive device terminals 114, 116 can be formed from conductive metals, such as tungsten or aluminum, or alternatively can be formed from highly-doped monocrystalline or polycrystalline semiconductors. The first and second electrically conductive device terminals 114, 116 are each in ohmic contact with the two-dimensional charge carrier gas channel 112. In a forward conducting state of the device, the first and second electrically conductive device terminals 114, 116 are conductively connected to one another via the two-dimensional charge carrier gas channel 112. In a blocking state of the device, the conductive connection between the first and second electrically conductive device terminals 114, 116 is interrupted and a voltage develops across the first and second electrically conductive device terminals 114, 116.

The semiconductor device 100 further includes a gate structure 118 that is disposed over the two-dimensional charge carrier gas channel 112 and is configured to control the conductive connection between the first and second electrically conductive device terminals 114, 116. The gate structure 118 includes an electrically conductive gate electrode 120 that is provided over the second type III-V semiconductor layer 110. In addition, the gate structure 118 may include a gate region 122 disposed between the gate electrode 120 and the second type III-V semiconductor layer 110. The gate region 122 can include an electrically insulating material, such as silicon dioxide ($SiO_2$) or silicon nitride (SiN). Alternatively, the gate region 122 can include a semiconductor, such as GaN. According to an embodiment, the gate structure 118 is configured to alter the intrinsic "normally-on" configuration of the device into a "normally-off" configured device. This configuration can be achieved by doping the gate region 122 to generate an electric field that depletes the two-dimensional charge carrier gas channel 112 in the absence of a gate bias. For instance, the gate region 122 can be a region of p-type GaN. Alternatively, according to another embodiment (not shown), the gate structure 118 is provided in a recessed portion of the second type III-V semiconductor layer 110. By removing a portion of the second type III-V semiconductor layer 110 such that a bottom of the recessed portion reaches or is close to the first type III-V semiconductor layer 108, the carrier supply to the two-dimensional charge carrier gas is disrupted and the two-dimensional charge carrier gas becomes locally depleted, In this way, a "normally-off" configuration is achieved.

The semiconductor device 100 further includes a field plate structure 124. The field plate structure 124 is formed over the second type III-V semiconductor layer 110 and is laterally between the gate electrode 120 and the second electrically conductive device terminal 116. The field plate structure 124 includes an electrically conductive field plate 126. The electrically conductive field plate 126 can be formed from conductive metals, such as tungsten or aluminum, or alternatively can be formed from highly-doped monocrystalline or polycrystalline semiconductors. The field plate structure 124 additionally includes an electrically insulating field plate dielectric 128 disposed between the electrically conductive field plate 126 and the two-dimensional charge carrier gas channel 112. The electrically insulating field plate dielectric 128 can be formed above or directly on the second type III-V semiconductor layer 110. The electrically conductive field plate 126 is configured to deplete the two-dimensional charge carrier gas during an OFF state of the semiconductor device 100 or during a transition to an OFF state of the semiconductor device 100. That is, the electrically conductive field plate 126 can be tied to a suitable potential such that, when the semiconductor device 100 is in the OFF state and/or is transitioning to the OFF state, the two-dimensional charge carrier gas is depleted in a region that is beneath the field plate 126. For instance, the electrically conductive field plate 126 can be tied to the same potential as the source (S) terminal or the gate (G) terminal of the semiconductor device 100 to achieve this effect.

The semiconductor device 100 further includes a plurality of doped regions 130 that are formed in the base substrate 102. The doped regions 130 vertically extend to an upper surface 106 of the base substrate 102 that directly faces the first type III-V semiconductor layer 108.

The doped regions 130 include first doped regions 132 having a first conductivity type (e.g., n-type) and second doped regions 134 having a second conductivity type (e.g., p-type). The first and second doped regions 132, 134 can have a relatively high doping concentration, e.g., greater than about $10^{16}$ dopant atoms/cm$^3$. In the case that the base substrate 102 is relatively lightly doped, the first doped regions 132 can correspond to regions that are intentionally doped to have a higher doping concentration than the intrinsic doping concentration of the base substrate 102. Alternatively, in the case that the base substrate 102 is relatively highly doped, the first doped regions 132 can correspond to intrinsically doped regions 130 of the base substrate 102.

The doped regions 130 can be formed according to a variety of suitable techniques. For instance, the doped regions 130 can be formed by implanting or diffusing dopant atoms into the upper surface 106 of the base substrate 102 prior to the deposition of the transition region 104. Masking techniques can be used to form the doped regions 130 in any desired geometry. According to another technique, the doped regions 130 are formed by epitaxially depositing a doped semiconductor layer on the base substrate 102, followed by patterned etching of the doped semiconductor layer, followed by epitaxial deposition of oppositely doped semiconductor material in the etched regions of the doped semiconductor layer.

In the depicted embodiment, the doped regions 130 are formed to successively alternate along a lateral cross section of the device that is coextensive with the first and second electrically conductive terminals 114, 116 of the semiconductor device 100. As a result, a plurality of p-n junctions 136 are formed along this cross section. More particularly, according to the depicted embodiments, three p-n junctions 136 are provided between along this cross section. One of the first doped regions 132 is in ohmic contact with the first electrically conductive device terminal 114, which is formed to vertically extend through the type III-V semiconductor material to reach the upper surface 106 of the base substrate 102. One of the second doped regions 134 is in ohmic contact with the second electrically conductive device terminal 116, which is formed to vertically extend through the type III-V semiconductor material to reach the upper surface 106 of the base substrate 102.

According to an embodiment, the semiconductor device 100 additionally includes a buried insulator layer 138 that is formed within the base substrate 102. The buried insulator layer 138 is vertically disposed between the p-n junctions 136 and a lower surface 140 of the type IV semiconductor base substrate 102 that is opposite from the upper surface 106. That is, the buried insulator layer 138 is vertically beneath a bottom of the doped regions 130, and is vertically above the lower surface 140 of the type IV semiconductor base substrate 102. The buried insulator layer 138 can include any a variety of insulating materials, such as silicon dioxide ($SiO_2$). The buried insulator layer 138 can correspond to the insulating layer from any commercially available silicon-on-insulator (SOI) wafer. The buried insulator layer 138 provides numerous advantages such as reduced parasitic capacitance and reduced leakage current in comparison to a correspondingly configured device without the buried insulator layer 138.

Figure 2:
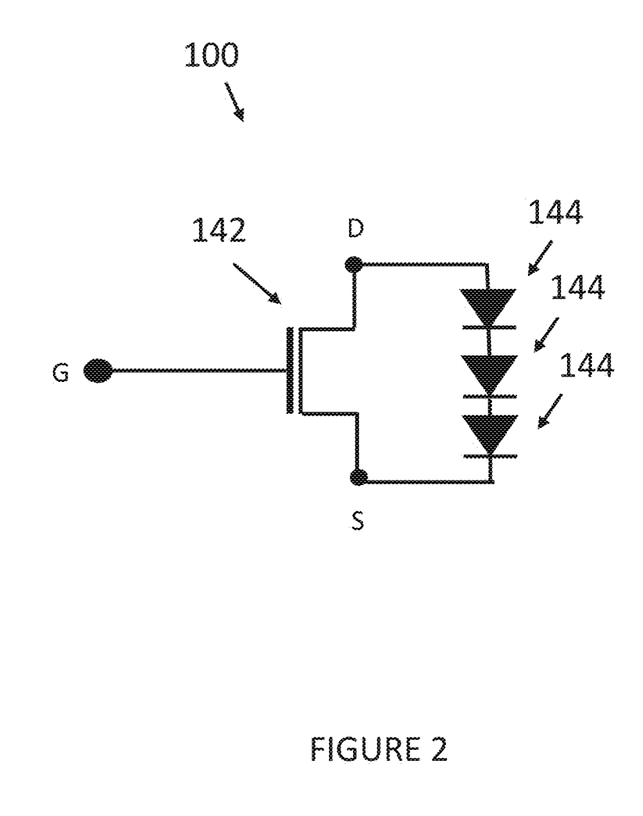
FIG. 2 illustrates an equivalent circuit schematic of the semiconductor device of FIG. 1, according to an embodiment.

Referring to FIG. 2, an electrical schematic of the type III-V semiconductor device 100 described with reference to FIG. 1 is depicted. The type III-V semiconductor device 100 includes a heterostructure field effect transistor (HEMT) 142, wherein the gate electrode 120 provides the gate (G) terminal of the HEMT 142, and the first and second electrically conductive device terminals 114, 116 provide the source (S) and drain (D) terminals of the HEMT 142, respectively. In addition, the type III-V semiconductor device 100 includes three diodes 144 connected between the source (S) and drain (D) terminals of the device. The three diodes 144 are provided by the doped regions 130 that are integrally formed within the type IV semiconductor base substrate 102.

In the depicted embodiment, each of the diodes 144 are electrically connected in series between the source (S) and drain (D) terminals. Moreover, these series connected diodes 144 are arranged in the same polarity relative to the source (S) and drain (D) terminals. That is, the cathode of one diode 144 in the group connects to the anode of the subsequent diode 144 in the group. In this way, each of the diodes 144 in the group electrically conduct in a first direction, i.e., from drain (D) to source (S), and each of the diodes in the group block electrical current in a second direction, i.e., from source (S) to drain (D). In this way, the diodes 144 provide an alternate current path for current to flow in the case of voltage spikes at the drain (D) of the device 100 due to electrostatic discharge conditions, inductive discharge conditions, etc. As a result of the current discharge provided by the diodes 144, sensitive components of the device including the gate region 122 and the field plate 126 dielectric are protected from potentially damaging currents and electric fields.

More generally, the device structure concept described with reference to FIG. 1 can be used to provide a heterostructure field effect transistor (HEMT) device with a plurality (i.e., two or more) of diodes 144 integrated within the semiconducting substrate of the device. For example, instead of three diodes 144, any number, such as two, four, five or more diodes 144 can be provided. As another example, the polarity of some or all of the diodes 144 in the plurality can be reversed, depending on the desired electrical function of the diodes. As another example, some of the diodes 144 in the plurality can be connected in parallel with one another, depending on the desired electrical function of the diodes 144. As another example, the diodes 144 can be tailored to achieve a variety of different transfer characteristics and/or current behavior, including rectifying, Schottky, tunneling, Zener, etc. Any of these different configurations can be achieved by appropriately configuring the doping in the base substrate 102, and/or by providing additional materials in the base substrate 102, such as metal or insulators, and/or by using known electrical connection techniques.

Referring to FIG. 3, a type III-V semiconductor device 100 is depicted, according to another embodiment. The type III-V semiconductor device 100 of FIG. 3 can be substantially similar or identical to the type III-V semiconductor device 100 described with reference to FIG. 1, with the exception of the configuration of the field plate 126, which will be described in further detail below. For example, the type III-V semiconductor device 100 can include any of the previously described features including, for example, the type IV semiconductor base substrate 102, the transition region 104, the first and second type III-V semiconductor layers 108, 110, the first and second electrically conductive device terminals 114, 116 and the gate structure 118. The type III-V semiconductor device 100 may include, but does not necessarily include, diodes 144 that are formed by the doped regions 130 (not shown in FIG. 3) in the base substrate 102 as previously described.

In the embodiment of FIG. 3, the field plate 126 includes a polysilicon layer 146. This polysilicon layer 146 is formed directly on the electrically insulating field plate dielectric 128. Moreover, the polysilicon layer 146 is deposited on the lateral region between the electrically insulating field plate dielectric 128 and the gate electrode 120 and is also deposited on the lateral region between the electrically insulating field plate dielectric 128 and the second electrically conductive device terminal 116. As a result, the polysilicon layer 146 forms a complete, continuous connection of conductive material between the gate electrode 120 and the second electrically conductive device terminal 116. Optionally, a region of metal or metal nitride, e.g., TiN, may be provided between the polysilicon layer 146 and the second electrically conductive device terminal 116 to improve the physical and electrical connection between the two.

The polysilicon layer 146 includes a series of doped regions 148. More particularly, the polysilicon layer 146 includes first doped regions 150 having a first conductivity type (e.g., n-type) and second doped regions 152 having a second conductivity type (e.g., p-type). As a result, the polysilicon layer 146 includes a number of p-n junctions at the interfaces between the first and second doped regions 150, 152, The doped regions 148 can be formed according to conventionally known doping techniques, such as ion implantation, etc.

Figure 4:
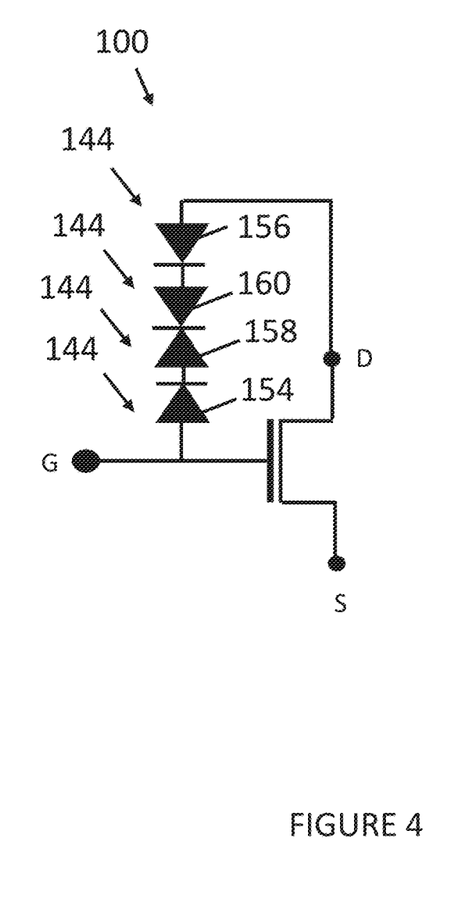
FIG. 4 illustrates an equivalent circuit schematic of the semiconductor device of FIG. 3, according to an embodiment.

Referring to FIG. 4, an electrical schematic of the type III-V semiconductor device 100 described with reference to FIG. 3 is depicted, according to an embodiment. The type III-V semiconductor device 100 includes a heterostructure field effect transistor (HEMT) 142, wherein the gate electrode 120 provides the gate (G) terminal of the HEMT 142, and the first and second electrically conductive device terminals 114, 116 provide the source (S) and drain (D) terminals of the HEMT 142, respectively. In addition, the type III-V semiconductor device 100 includes four diodes 144 connected between the gate (G) and drain (D) terminals of the device 100. The four diodes 144 are provided by the doped regions 148 that are integrally formed within the field plate 126 of the semiconductor device 100.

In the depicted embodiment, the series connected diodes 144 are arranged with different polarity so as to block electrical current flowing in both directions between the gate (G) terminal and the drain (D) terminal of the HEMT. More particularly, an anode of a first diode 154 is directly electrically connected to the gate (G) terminal, an anode of a second diode 156 is directly electrically connected to the drain (D) terminal, and a cathode of a third diode 158 is directly electrically connected a cathode of a fourth diode 160. As a result, the first and third diodes 154, 146 electrically conduct in a first direction going from the gate (G) terminal to the drain (D) terminal and block electrical current in a second direction going from the drain (D) terminal to the gate (G) terminal. Conversely, the second and fourth diodes 156, 160 electrically conduct in the second direction going from the drain (D) terminal to the gate (G) terminal and block electrical current in the first direction going from the gate (G) terminal to the drain (D).

By connecting the diodes 144 so as to block electrical current flowing in both directions in the above described manner, different ones of the diodes are in forward conducting mode and reverse blocking mode, depending upon the voltages present at the gate (G) and drain (D) terminals of the HEMT, One benefit of this configuration is that it protects the device 100 from dangerous overvoltage conditions. If, for instance, the drain (D) experiences a voltage spike due to electrostatic discharge conditions, inductive discharge conditions, etc., the first and third diodes 154, 158 are in a blocking mode. As a result, the first and third diodes 154, 158 protect sensitive components of the device including the gate region 122 and the field plate 126 dielectric from the potentially damaging electric fields associated with the voltage spike. Another benefit of this configuration is that it evenly distributes a voltage difference across multiple lateral locations of the electrically insulating field plate dielectric 128. If, for instance, the gate voltage exceeds the drain voltage, the second and fourth diodes 156, 160 are in a blocking mode and therefore prevent an electrical short between gate (G) and drain (D). Moreover, in this state, the second and fourth diodes 156, 160 evenly distribute the gate-drain voltage across the electrically insulating field plate dielectric 128. This enables better depletion of the two-dimensional charge carrier gas channel 112 during an OFF state transition of the device 100, and therefore improves the switching losses of the device 100.

More generally, the device structure concept described with reference to FIG. 3 can be used to provide a heterostructure field effect transistor (HEMT) device with any number of diodes integrated within the field plate 126 of the device and/or with any number of diodes connected between the gate (G) and drain (D) terminals of the device. For example, instead of four diodes 144, any number, such as one, two, three, five or more diodes 144 can be provided. As another example, the polarity of some or all of the diodes 144 can be changed, depending on the desired electrical function of the diodes 144. As another example, some of the diodes 144 in the plurality can be connected in parallel with one another, depending on the desired electrical function of the diodes 144. As another example, the diodes 144 can be tailored to achieve a variety of different transfer characteristics and/or current behavior, such as rectifying, Schottky, tunneling, Zener, etc. Any of these different configurations can be achieved by appropriately configuring the doping of the polysilicon layer 146, including materials other than polysilicon in the field plate structure 124, such as metal, and by using known electrical connection techniques.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device 100 100 may have AlInN/AlN/GaN barrier/spacer/buffer layer structures.

In general, III-V semiconductor materials, such as GaN, are used to form high electron mobility semiconductor devices according to the embodiments described herein. With GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas such as a 2DEG (two-dimensional electron gas) or 2DHG (two-dimensional hole gas) forms the channel region of the device. A thin, e.g. 1-2 nm, AlN layer can be provided between the GaN buffer layer and the alloy barrier layer to minimize alloy scattering and enhance 2DEG mobility. Other combinations of III-V semiconductor materials can be used in order to form a 2DEG or 2DHG channel region, as is well known in the art. In general, any heterostructure can be used where a band discontinuity is responsible for the device concept. For example, with an AlGaAs system there is no piezoelectric effect, but a confinement concept which involves arranging quantum wells for confinement of the channel region is possible.

The term "in ohmic contact" or "directly electrically connected" describes a permanent, non-rectifying electrical connection provided by electrical conductors that has linear current-voltage (l-V) characteristics, as with Ohm's law. By contrast, the term "electrically coupled" means that one or more intervening element(s) configured to influence the electrical signal in some tangible way is provided between the electrically coupled elements. These intervening elements include active elements, such as transistors, as well as passive elements, such as inductors, capacitors, diodes, resistors, etc.

The term "lateral" as used in this specification intends to describe an orientation substantially parallel to a first or main surface of a semiconductor substrate or body, This can be for instance the surface of a wafer or a die.

The term "vertical" as used in this specification intends to describe an orientation that is substantially arranged perpendicular to the main surface, i.e. parallel to the normal direction of the first surface of the semiconductor substrate or body.

In this specification, n-doped is referred to as first conductivity type while p-doped is referred to as second conductivity type. Alternatively, the semiconductor device can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration that is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures, Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a type IV semiconductor base substrate;
a first type III-V semiconductor layer formed over a first surface of the base substrate;
a second type III-V semiconductor layer formed over the first type III-V semiconductor layer, the second type III-V semiconductor layer having a different bandgap as the first type III-V semiconductor layer such that a two-dimensional charge carrier gas forms at an interface between the first and second type III-V semiconductor layers;
first and second electrically conductive device terminals each being in ohmic contact with the two-dimensional charge carrier gas and laterally spaced apart from one another,
a gate electrode formed on the first type III-V semiconductor layer and being configured to control a conduction state of the two-dimensional charge carrier gas between the first and second electrically conductive device terminals;
an electrically insulating region disposed over the second type III-V semiconductor layer and being laterally between the gate electrode and the second electrically conductive device terminal; and
a plurality of diodes electrically connected between the gate electrode and the second electrically conductive device terminal,
wherein the a plurality of diodes are formed on the electrically insulating region,
wherein each of the diodes in the plurality are electrically connected in series with one another,
wherein an anode of a first diode in the plurality is directly electrically connected to the gate electrode,
wherein an anode of a second diode in the plurality is directly electrically connected to the second electrically conductive device terminal, and
wherein cathodes of two diodes in the plurality are directly electrically connected to one another.

2. The semiconductor device of claim 1, wherein the plurality comprises at least four of the diodes, wherein two of the diodes in the plurality are arranged in a first a polarity so as to electrically conduct in a first direction, and wherein two of the diodes in the plurality are arranged in a first a polarity so as to electrically conduct in a second direction, the second direction being opposite from the first direction.

3. The semiconductor device of claim 1 wherein semiconductor device further comprises a layer of polysilicon that is deposited on the electrically insulating region, and wherein the plurality of the diodes is integrally formed in the layer of polysilicon.

4. The semiconductor device of claim 1, wherein the plurality of diodes is formed by a series of doped regions in the layer of polysilicon.

5. A semiconductor device, comprising:
a type IV semiconductor base substrate;
a first type III-V semiconductor layer formed over a first surface of the base substrate;
a second type III-V semiconductor layer formed over the first type III-V semiconductor layer, the second type III-V semiconductor layer having a different bandgap as the first type III-V semiconductor layer such that a two-dimensional charge carrier gas forms at an interface between the first and second type III-V semiconductor layers;

first and second electrically conductive device terminals each being in ohmic contact with the two-dimensional charge carrier gas and laterally spaced apart from one another, a gate electrode formed on the first type III-V semiconductor layer and being configured to control a conduction state of the two-dimensional charge carrier gas between the first and second electrically conductive device terminals;

an electrically conductive field plate disposed over the second type III-V semiconductor layer and being laterally between the gate electrode and the second electrically conductive device terminal, wherein the electrically conductive field plate is configured to deplete the two-dimensional charge carrier gas during an off state of the two-dimensional charge carrier gas, and wherein the electrically conductive field plate comprises at least one diode integrally formed within the electrically conductive field plate wherein the electrically conductive field plate comprises a plurality of the diodes, wherein each of the diodes in the plurality are electrically connected in series with one another, wherein an anode of a first diode in the plurality is directly electrically connected to the gate electrode, wherein an anode of a second diode in the plurality is directly electrically connected to the second electrically conductive device terminal, and wherein cathodes of two diodes in the plurality are directly connected to one another.

6. The semiconductor device of claim 5 further comprising:

an electrically insulating region disposed over the second type III-V semiconductor layer and being laterally between the gate electrode and the second electrically conductive device terminal; and a polysilicon layer formed directly on the electrically insulating region, wherein each of the diodes in the plurality is formed in the polysilicon layer.

7. The semiconductor device of claim 6, wherein each of the diodes in the plurality are formed by a plurality of p-n junctions in the polysilicon layer, and wherein the p-n junctions of the plurality are arranged to distribute a voltage difference between the gate electrode and the second electrically conductive device terminal across multiple lateral locations of the electrically insulating region.

8. A semiconductor device, comprising:
a type IV semiconductor base substrate;
a first type III-V semiconductor layer formed over a first surface of the base substrate;
a second type III-V semiconductor layer formed over the first type III-V semiconductor layer, the second type III-V semiconductor layer having a different bandgap as the first type III-V semiconductor layer such that a two-dimensional charge carrier gas forms at an interface between the first and second type III-V semiconductor layers;
first and second electrically conductive device terminals each being in ohmic contact with the two-dimensional charge carrier gas and laterally spaced apart from one another,
a gate electrode formed on the first type III-V semiconductor layer and being configured to control a conduction state of the two-dimensional charge carrier gas between the first and second electrically conductive device terminals; and
a plurality of diodes electrically connected between the first and second electrically conductive device terminals,
wherein each of the diodes in the plurality are integrally formed within the type IV semiconductor base substrate,
wherein each of the diodes in the plurality are arranged with the same polarity relative to the first and second electrically conductive device terminals such that each of the diodes in the plurality electrically conduct in a first direction between the first and second electrically conductive device terminals and such that each of the diodes in the plurality block electrical current in a second direction between the first and second electrically conductive device terminals.

9. The semiconductor device of claim 8, wherein the plurality of diodes comprises at least three diodes.

10. The semiconductor device of claim 8, wherein the plurality of diodes is formed by a plurality of p-n junctions that are formed in the type IV semiconductor base substrate, wherein each p-n junction in the plurality extends to an upper surface of the type IV semiconductor base substrate, the upper surface of the type IV semiconductor base substrate directly facing the first type III-V semiconductor layer.

11. The semiconductor device of claim 10, wherein the type IV semiconductor base substrate further comprises a buried insulator layer, wherein the buried insulator layer is disposed within the type IV semiconductor base substrate between the plurality of p-n junctions and a lower surface of the type IV semiconductor base substrate that is opposite from the upper surface.

12. The semiconductor device of claim 8, wherein the base substrate comprises silicon, wherein the first type III-V semiconductor layer comprises GaN, and wherein the second type III-V semiconductor layer comprises AlGaN.

13. A semiconductor device, comprising:
a type IV semiconductor base substrate;
a first type III-V semiconductor layer formed over a first surface of the base substrate;
a second type III-V semiconductor layer formed over the first type III-V semiconductor layer, the second type III-V semiconductor layer having a different bandgap as the first type III-V semiconductor layer such that a two-dimensional charge carrier gas forms at an interface between the first and second type III-V semiconductor layers;
first and second electrically conductive device terminals each being in ohmic contact with the two-dimensional charge carrier gas and laterally spaced apart from one another,
a gate electrode formed on the first type III-V semiconductor layer and being configured to control a conduction state of the two-dimensional charge carrier gas between the first and second electrically conductive device terminals; and
a plurality of diodes electrically connected between the first and second electrically conductive device terminals,
wherein each of the diodes in the plurality are integrally formed within the type IV semiconductor base substrate,
wherein the plurality of diodes is formed by a plurality of p-n junctions that are formed in the type IV semiconductor base substrate, wherein each p-n junction in the plurality extends to an upper surface of the type IV semiconductor base substrate, the upper surface of the type IV semiconductor base substrate directly facing the first type III-V semiconductor layer.

14. The semiconductor device of claim 13, further comprising a transition region disposed between the upper surface of the type IV semiconductor base substrate and the first type III-V semiconductor layer.

* * * * *

UNITED STATES PATENT AND TRADEMARK OFFICE
CERTIFICATE OF CORRECTION

PATENT NO. : 10,128,228 B1
APPLICATION NO. : 15/629783
DATED : November 13, 2018
INVENTOR(S) : G. Gao et al.

Page 1 of 1

It is certified that error appears in the above-identified patent and that said Letters Patent is hereby corrected as shown below:

In the Claims

At Column 12, Line 29, Claim 1, Line 28, please delete "a" before plurality.
At Column 12, Line 42, Claim 2, Line 3, please delete "a" before polarity.
At Column 12, Line 44, Claim 2, Line 5, please delete "a" before polarity.

Signed and Sealed this
Twenty-second Day of January, 2019

Andrei Iancu
*Director of the United States Patent and Trademark Office*